United States Patent [19]

Holberton et al.

[11] Patent Number: 4,525,669
[45] Date of Patent: Jun. 25, 1985

[54] POWER MEASUREMENT IN AN ELECTRICAL DISTRIBUTION SYSTEM HAVING THREE OR MORE WIRES

[75] Inventors: Philip M. Holberton, Norcross; Bruce E. Randall, Alpharetta; Jay K. Marshall, Marietta, all of Ga.

[73] Assignee: Sangamo Weston, Inc., Norcross, Ga.

[21] Appl. No.: 451,306

[22] Filed: Dec. 20, 1982

[51] Int. Cl.³ .................... G01R 21/00; G01R 21/08
[52] U.S. Cl. ................ 324/142; 324/117 H; 324/127
[58] Field of Search .............. 324/107, 117 R, 117 H, 324/142, 127, 132; 323/355, 368, 361

[56] References Cited

U.S. PATENT DOCUMENTS

| | | |
|---|---|---|
| 2,788,491 | 4/1957 | Millar . |
| 2,814,015 | 11/1957 | Kuhrt . |
| 2,885,629 | 5/1959 | Tschermak . |
| 2,988,650 | 6/1961 | Weiss . |
| 2,988,707 | 6/1961 | Kuhrt et al. . |
| 3,054,952 | 9/1962 | Lehrmann . |
| 3,343,084 | 9/1967 | Gambale et al. . |
| 3,439,270 | 4/1969 | Rehm . |
| 3,497,804 | 2/1970 | Schmidt et al. ............ 324/107 |
| 3,718,861 | 2/1973 | Ramsey, Jr. . |
| 3,921,069 | 11/1975 | Milkovic . |
| 4,160,950 | 7/1979 | Houldsworth .............. 324/117 H |
| 4,199,696 | 4/1980 | Tanaka et al. . |
| 4,437,059 | 3/1984 | Hauptmann ................ 324/107 |

OTHER PUBLICATIONS

C. Lowman, "Magnetic Recording", 1972, pp. 69–75.

Primary Examiner—Stewart J. Levy
Assistant Examiner—S. Baker
Attorney, Agent, or Firm—Dale Gaudier

[57] ABSTRACT

A system for measuring power in an electrical distribution circuit having at least three wires includes a Hall-effect generator directly coupled to one of the live wires of the circuit and current transformers coupled to the other live wires of the circuit. The output of each current transformer is magnetically linked to the Hall-effect generator. The excitation current for the Hall-effect generator is derived from the line potential between the live wires. The Hall-effect generator acts to produce an output whose magnitude is directly proportional to the product of the vector sums of the currents flowing in the live wires and the potential between the live wires. This power indicative output may be accumulated to produce an indication of energy consumed by a load connected to the live wires. A high frequency A.C. bias is applied to the Hall generator in order to linearize the output of the generator.

12 Claims, 7 Drawing Figures

POWER MEASUREMENT IN AN ELECTRICAL DISTRIBUTION SYSTEM HAVING THREE OR MORE WIRES

BACKGROUND OF THE INVENTION

1. Field of the Invention

The invention relates to the field of power measuring devices and, more particularly, to power measuring devices for measuring A.C. power in an electrical distribution system having three or more wires.

2. Description of the Prior Art

Electrical distribution systems for supplying electricity to consumers are generally characterized by comprising two or more live wires, and may further include a ground return path. Typically, North American electrical distribution systems use a three-wire single-phase arrangement with one wire being neutral or at ground potential and the other two wires being at an elevated potential with respect thereto. Generally speaking, the voltages in the two live wires are 180° out of phase with each other such that the instantaneous peak-to-peak potential difference between the two wires, $E_O$ (for example 240 volts), is twice the potential between a live wire and the neutral or ground. Thus it is possible to drive loads requiring two different supply voltages from the same transmission system. For example some appliances, such as electrical dryers or stoves which consume large amounts of current, are operated more efficiently at the full potential $E_O$ (240 volts), whereas less current-hungry electrical appliances and lighting fixtures can be run at the less hazardous 120 volt potential which exists between one of the live wires and the neutral wire.

In metering the amount of power consumed by loads which are connected to the three-wire distribution circuit it is necessary that the currents be measured in each of the live wires or branches since the current may flow between one live wire and neutral or the other live wire and neutral or in both live wires depending upon the connection of loads to the three-wire system. Thus it is conventional to separately measure the currents in each of the live wires and to multiply these currents times the applied voltage $E_O$ to obtain a measure of instantaneous power or demand (measured in watts). This multiplication can take place by means of a conventional electro-mechanical induction-type wattmeter mechanism. If the measured power is integrated over time, such as through a conventional clock-type register or electronic accumulator, the result is a measure of energy used by the load over the measurement time interval (in watt-hours, for example).

It is also known to use materials which exhibit a galvanomagnetic effect, such as the so-called Hall-effect, as power measuring devices. As is well-known, when an alternating current is inductively coupled to a magnetic core having a gap in which a plate of galvanomagnetic material is disposed, a flux is induced in the gap which is proportional to the current being measured in the line. If an excitation current is derived from the electrical network's supply voltage, $E_O$, and is applied to the plate of galvanomagnetic material a voltage will be induced in the galvanomagnetic material which is directly proportional to the product of the excitation current (which is proportional to the supply potential $E_O$) and the current flowing in the measured wire. Thus the output of the device is a voltage which is directly proportional to the instantaneous power being delivered by the current-carrying wire. The use of such a Hall generator as a watt transducer is shown, for example, in U.S. Pat. No. 3,343,084.

As stated above, in a three-wire transmission system it is necessary to measure the currents flowing in each of the live wires in order that all the power may be accurately measured. When Hall generators are used as watt transducers the same constraint applies: the current in each live wire must be measured and combined in a fashion such as to produce an accurate indication of the amount of power being consumed by one or more loads connected to the transmission system.

One such prior art system is shown in FIG. 1 and utilizes separate Hall generators 1 and 3 which measure the currents in each of the live wires L1 and L2 respectively. The output of each of the Hall generators 1 and 3 is a voltage whose magnitude is directly proportional to the power flowing respectively in wires L1 and L2. The outputs of Hall generators 1 and 3 are applied to a summing circuit 5 whose output is indicative of the total power flowing in the live wires L1 and L2 to one or more loads connected to the transmission system. Such a system is shown in U.S. Pat. No. 3,054,952 wherein an oscillograph is used as the means for summing the power indicative voltages from the Hall generators in each branch of the electrical transmission system. However, such an arrangement is expensive since it requires a pair of Hall generators and a separate summing circuit. The accuracy of such an arrangement is highly dependent on accurate matching of the characteristics of each of the Hall-effect generators.

It is also possible to couple a single Hall generator to both of the live wires in a three-wire single-phase transmission system as shown in FIG. 2. In this arrangement, the magnetic field being induced in the Hall generator 1 by the currents in each of the live wires L1 and L2 is magnetically summed in the magnetic core of the Hall generator. The output voltage of the Hall generator is directly proportional to the total amount of power being transmitted through wires L1 and L2.

However, this arrangement has the drawback that both of the supply wires L1 and L2 must be physically proximate to the Hall generator 1. This is not always possible due to installation and/or physical limitations. For example, electrical service to a home or apartment is generally through a junction box containing sets of fuses or circuit breakers for each branch circuit. The live and neutral wires which come from the electricity supplier's distribution transformer generally are eight gauge or heavier and are encased in a protective sheath. At the point of entering the junction box the two live wires are split and run to two parallel busses to which the fuses or circuit breakers are connected. Because of the physical limitations and the gauge of the live wires it is virtually impossible to place both live wires in proximity to the magnetic circuit of a single Hall generator.

In addition to the above, when used as watt transducers Hall generators suffer from a further defect in that their output signal is a distorted version of the measured current signal. This is due to the well known phenomena that the graph of magnetic induction (B) versus magnetic force (H) in the gap of a magnetic circuit (such as a broken toroid of ferromagnetic material) is not a smooth curve or a straight line but rather a rather non-linear function. Thus the smooth periodic nature of the measured current being applied to the magnetic circuit will be distorted by the characteristic non-linear function of the magnetic circuit about its zero point to produce an output which is a distorted version of the input signal.

SUMMARY OF THE INVENTION

These and other drawbacks of prior art arrangements are overcome by the present invention wherein there is provided a system for measuring alternating current transmitted over distribution lines having at least three lines or wires wherein one line is at ground potential and at least two lines are at an elevated potential with respect thereto. The system includes a galvanomagnetic transducer, such as a Hall-effect generator, which includes a magnetic circuit (such as a gapped toroidal core and a galvanomagnetic material disposed in the gap), coupled to one of the elevated (live) lines. Additional magnetic circuits, such as individual current transformers, are coupled to each of the other elevated lines. Means, such as a pair of transformer windings disposed respectively about each current transformer and the magnetic circuit of the transducer, are provided for magnetically linking each current transformer and the magnetic circuit of the transducer together. In this manner the magnetic flux which is induced in the transducer is proportional to the vector sum of the currents in each of the elevated lines.

Advantageously, the use of a Hall-effect generator as a transducer means enables instantaneous power flowing through the live wires to be measured directly. If a signal is derived from the voltage potential between the live wires and/or the neutral wire and is applied to a terminal of a plate of material exhibiting galvanomagnetic properties disposed in the gap of the magnetic circuit, an output voltage will be generated by the material at terminals disposed perpendicular to the current flow between the first pair of terminals. This voltage is proportional to the product of the vector sum of the currents flowing in the live wires and the potential between these wires, i.e. instantaneous power flowing through the wires.

This power indicative voltage can be applied, for example, to a voltage-to-frequency converter whose output will be a series of pulses having a frequency which is directly proportional to the instantaneous power flowing through the live wires. These output pulses can be applied to a frequency counter to give a direct readout of the measured instantaneous power. Further, these pulses can be applied to an accumulator, such as an electronic adder or an electric stepper motor which drives a clock or cyclometer escapement mechanism, which acts to integrate the power over a given time period. This, in effect, produces an output indicative of the energy (power consumed over unit time) being used by one or more loads connected to the power distribution system.

With the above arrangement, the need for more than one Hall-effect generator is eliminated, while still insuring that current and power flowing in each of the live wires will be properly measured. Since each current transformer is magnetically linked to the Hall-effect generator via a pair of electrically connected transformer windings it may be located at a position remote from the Hall generator. This is especially advantageous where the two or more live wires are not located in physical proximity to each other at the point of power measurement.

A further advantage to the above-described arrangement is that the summation of the currents flowing in each of the live wires is done automatically and magnetically in the magnetic circuit of the Hall generator. Further, when the galvanomagnetic material is energized by a potential derived from the distribution lines, the output voltage induced in the galvanomagnetic material will be directly proportional to the power flowing through the live wires to one or more loads. This eliminates the need for electronic or electromechanical multipliers for obtaining the product of instantaneous voltage and instantaneous current.

In addition to single phase power measurement, the described arrangement can be used to measure polyphase power in the distribution lines through the use of appropriate phase shifting circuitry interposed in the magnetic link between each of the current transformers and the Hall generator.

The operating characteristics of the invention are further enhanced by applying an alternating current bias signal of frequency substantially greater than that of the line frequency of the distribution system to the magnetic circuit of the Hall generator. This A.C. bias acts to shift the operation of the magnetic circuit over a more linear portion of its characteristic graph of magnetic induction versus magnetic force (the so-called B-H curve). This causes the output of the Hall generator to be more nearly linear with changes in the flux induced in the magnetic circuit, resulting in less distortion of the output.

BRIEF DESCRIPTION OF THE DRAWING FIGURES

These and other features and advantages of the present invention will be apparent from the following detailed description of the preferred embodiments when taken in conjunction with the accompanying drawing figures, wherein.

DESCRIPTION OF THE PREFERRED EMBODIMENTS

Figure 1:
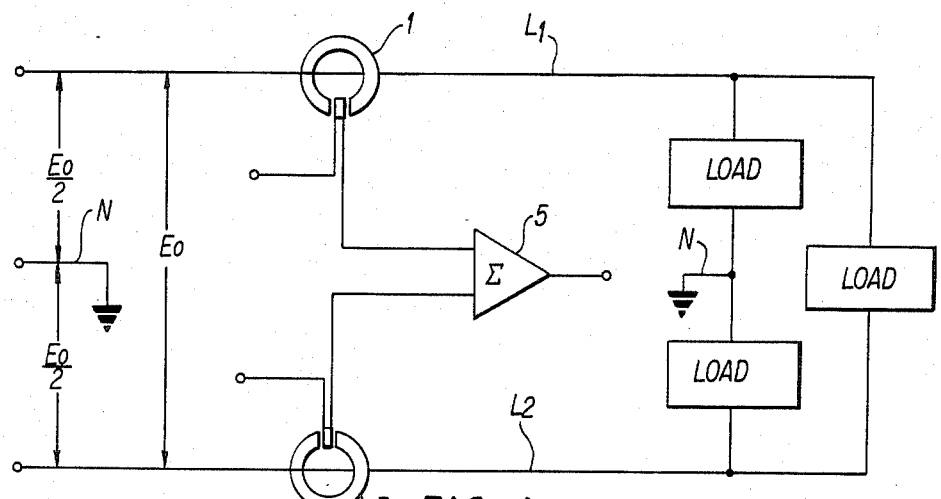
FIGS. 1 and 2 are diagrams of two types of prior art power measuring systems for three-wire distribution lines using Hall generators.
Figure 2:
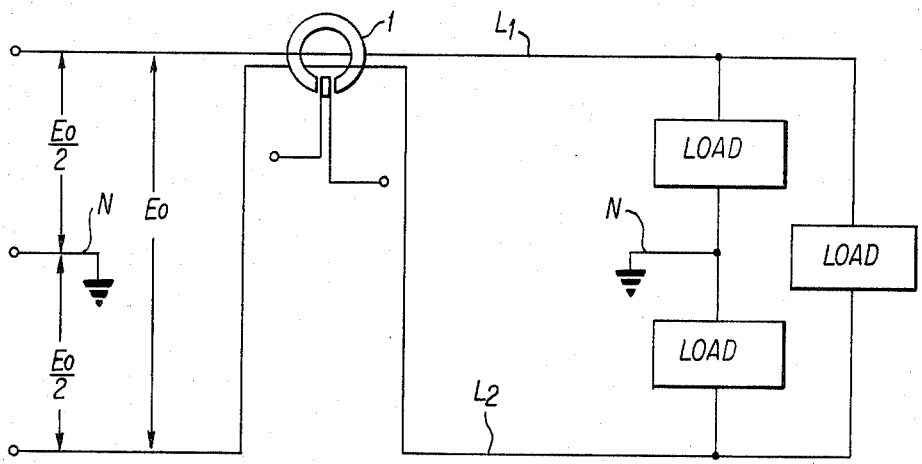
Figure 3:
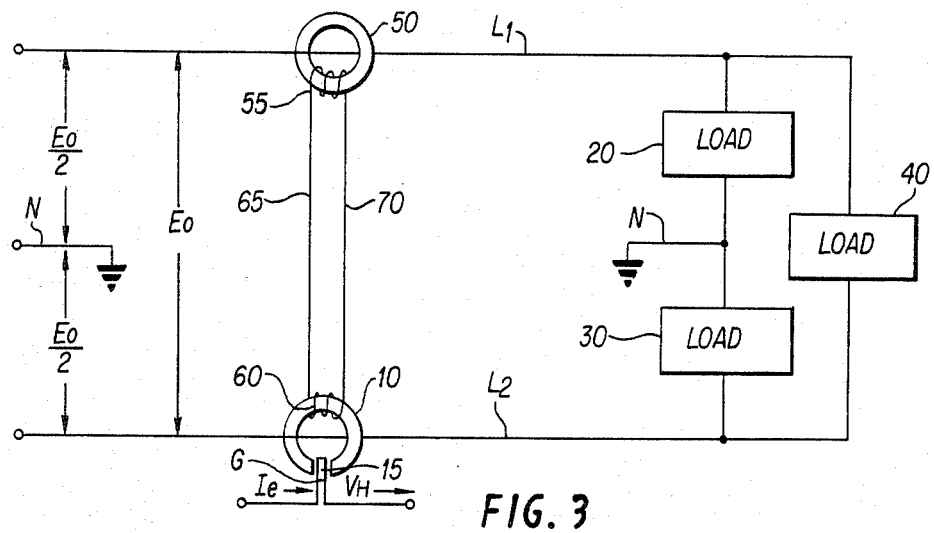
FIG. 3 is a diagram depicting the basic concept of the present invention.

With reference to FIG. 3, there is shown a diagrammatic representation of the present invention. A three-wire single-phase distribution system, comprising a neutral wire N and a pair of live wires L1 and L2, which are at a potential elevated with respect to the neutral wire N, apply current to one or more loads 20, 30 and 40. The potential, $E_O$, applied between the two live wires L1 and L2 is approximately 240 volts for domestic single phase, 60 Hz service. The potential between each of the live wires L1 and L2 and the neutral wire N is approximately half the potential $E_O$ between the two live wires, i.e. 120 volts for the example given. Thus each of the loads 20 and 30 which are connected respectively between live wire L1 and neutral and live wire L2 and neutral will see a potential of 120 volts whereas load 40, which is connected between each of the live wires L1 and L2, will see a potential of 240 volts.

The two branches of the electrical distribution system comprised of lines L1, N and L2, N are usually arranged in a manner such that the amount of load potentially to be applied to each branch is substantially balanced. In this fashion the return current flowing through the neutral wire from each of the two branches will normally cancel out. Because the currents will substantially cancel in the neutral wire, power cannot be properly monitored through this wire even though it is common to both of the branch circuits. In addition, no current flows through the neutral wire when a load, such as load 40, is applied across the two live wires L1 and L2.

In order to accurately measure the current, and hence the power, flowing in each of the live wires L1 and L2 to the one or more loads 20, 30 and 40 it is necessary to monitor the current in each wire L1 and L2. In the present invention this is done by monitoring the current in live wire L1 by means of a current transformer shown generally at 50, which is magnetically linked via a transformer winding 55 disposed about the current transformer 50 and coupled to a similar winding 60 disposed about the magnetic circuit of a Hall generator 10 by means of a pair of wires 65 and 70. Thus any current induced in current transformer 50 by the first live wire L1 will be magnetically linked to the magnetic circuit of the Hall generator 10. Of course, the magnetic coupling may be done indirectly by coupling Hall generator 10 to a live wire via an additional current transformer (not shown) which is directly coupled to the live wire. Thus the term "coupling" as used herein includes both direct and indirect coupling arrangements.

Hall generator 10 in turn is magnetically coupled directly to the second live wire L2 and develops a magnetic field which is proportional to the current flowing through the second live wire L2. This magnetic field and that induced in current transformer 50 and coupled to Hall generator 10 via magnetic link 55, 60, 65 and 70 will cause the total flux in a gap G formed in the magnetic circuit of Hall generator 10 to be directly proportional to the vector sum of the currents flowing in live wires L1 and L2. If a plate of galvanomagnetic material 15 is placed within gap G and is excited by an excitation current $I_e$ the material will produce at points within the plane of the material but at right angles to the current flow a voltage $V_H$ which is directly proportional to the magnitude of the flux in gap G. Thus the magnitude of $V_H$ is directly proportional to the vector sum of the currents flowing in live wires L1 and L2.

Materials which exhibit galvanomagnetic properties are called Hall-effect materials. The properties of such materials and the construction and operation of Hall-effect generators are well-known and are discussed at length in "Structure and Application of Galvanomagnetic Devices" by H. Weiss, Pergamon Press, 1969.

Figure 4:
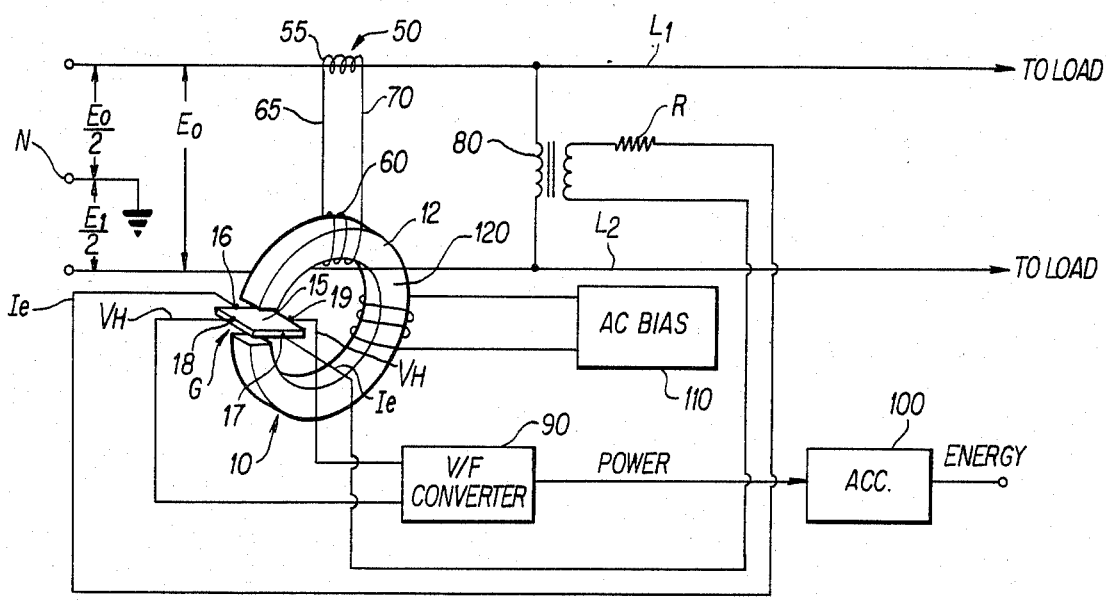
FIG. 4 is a more detailed representation of the diagram of FIG. 3.

As shown in more detail in FIG. 4, Hall-effect generator 10 includes a magnetic circuit 12, for example a toroid formed from a ferromagnetic material, having a gap G formed therein. Within the gap there is disposed a plate of galvanomagnetic material 15 which is arranged with its planar surfaces substantially parallel to the inner faces of the gap G formed in the magnetic circuit 12. Opposite edges of plate 15 have terminals 16 and 17 formed thereon for receiving an excitation current $I_e$. The excitation current $I_e$ preferably is derived from the potential $E_O$ between each of the live wires L1 and L2 by means of a voltage transformer 80 having its primary connected between live wires L1 and L2 and its secondary connected through a resistor R to terminals 16 and 17 of plate 15. The value of resistor R is chosen to be much greater than the internal resistance of the plate of material 15 (on the order of two to three orders of magnitude greater) so that the voltage transformer and resistance combine to act as a current source for the excitation current $I_e$ being supplied to plate 15.

The time varying alternating current flowing in live wire L1 induces in current transformer 50 a time varying magnetic field whose instantaneous magnitude is directly proportional to the instantaneous value of the current flowing in live wire L1. The magnetic field from current transformer 50 is coupled to magnetic circuit 12 and Hall generator 10 by means of transformer windings 55 and 60 and electrical links 65 and 70. Thus, the magnetic field induced in transformer 50 is magnetically linked to magnetic circuit 12. This causes a magnetic flux to appear across gap G which is proportional to the magnetic field induced in the current transformer 50, which in turn is proportional to current flowing in live wire L1.

In addition to the magnetic flux induced by current transformer 50, a second magnetic flux is induced by the magnetic field which accompanies current flowing through live wire L2. Hall generator 10 is placed in physical proximity to live wire L2 such that the magnetic field accompanying the current in live wire L2 is directly coupled to magnetic circuit 12. This magnetic coupling can constitute one or more ampere turns of wire L2 physically coupled to magnetic circuit 12.

As will be appreciated, the total flux appearing in gap G of magnetic circuit 12 will be the vector sum of each of the magnetic fluxes being induced therein due to the currents flowing in live wires L1 and L2. With an excitation current $I_e$, which is directly proportional to the potential being applied across live wires L1 and L2, the plate of galvanomagnetic material 15 will have a voltage $V_H$ induced therein at a pair of terminals 18 and 19 disposed on opposite edges of plate 15 and perpendicular to the excitation current flow between terminals 16 and 17. The magnitude of this induced voltage $V_H$ is directly proportional to the product of the vector sum of the magnetic fluxes induced by the currents flowing through live wires L1 and L2 and the potential $E_O$ between these two live wires. Thus, the induced output voltage $V_H$ in plate 15 is directly proportional to the instantaneous power (voltage times current) flowing to one or more loads connected to live wires L1 and L2.

This induced voltage may be read out directly such as by means of a voltmeter, to give an indication (when properly scaled) of the instantaneous power or demand flowing to the loads.

A more useful technique, though, is to apply this power-representative voltage to a voltage-to-frequency converter 90. The output of the voltage-to-frequency converter is a series of pulses whose frequency is proportional to the applied voltage. If the output of voltage-to-frequency converter 90 is properly scaled and applied to a frequency counter the output of the counter at any given time is a direct representation of instantaneous power. If the counts are accumulated by the frequency counter over a preselected period of time, the total number of counts is indicative of the amount of energy (power over interval time) being consumed by the one or more loads connected to the distribution circuit. Alternatively, a separate accumulator 100 may be provided which will count the pulses output by voltage-to-frequency converter 90 over a given time interval. Examples of such accumulators are electronic registers or counters, or a stepper motor which is responsive to the pulses output by converter 90 to drive a clock-type or cyclometer-type escapement mechanism to integrate the power over a given time interval.

As can be seen, the above-described arrangement enables current or power in a three-wire distribution system to be accurately measured through the use of a single Hall-effect device which is directly coupled to one of the live wires of the distribution system while being indirectly coupled to the other live wire of the distribution system. The summing of the two currents in each of the live wires is done magnetically in the magnetic circuit of the Hall generator without the need for further electronics. When the Hall generator is energized by the line potential the output of the Hall generator is directly proportional to the instantaneous power flowing through the live wires.

The concepts of the present invention can be readily extended to power distribution systems having more than three wires or which carry more than one phase of electrical power (e.g. two-phase and three-phase power transmission systems). For example, Hall generator 10 can be directly coupled to one of the live wires in a polyphase distribution system while each of the one or more remaining live wires are provided with a current transformer. Each such current transformer is magnetically linked to the Hall generator via conventional phase-shifting circuitry to ensure that current is being measured at the same phase angle in each live wire. The currents flowing in each of the live wires are magnetically summed in the Hall generator. If the Hall generator is energized by a current derived from the line potential, its output will be directly proportional to power flowing to one or more loads connected to the distribution circuit.

Figure 5:
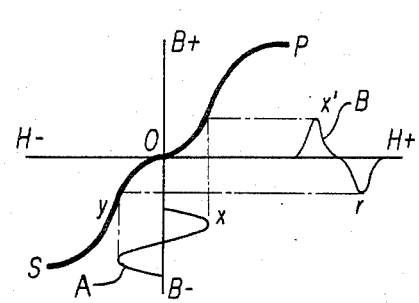
FIG. 5 is a graph of magnetic induction versus magnetic force for a Hall generator in which no A.C. bias is applied.

In addition to the above arrangements, it has been discovered that the application of a high frequency alternating current bias signal to magnetic circuit 12 of Hall generator 10 improves the linearity of the output $V_H$ of the Hall generator. As shown in FIG. 5, a magnetic circuit such as magnetic circuit 12 will exhibit a characteristic transfer function relating the magnetic induction B of the circuit to the magnetic force H due to such induction. If a sinusoidal input signal A is applied to a magnetic circuit the magnetic flux appearing in the circuit (waveform B) will be a distorted version of the input signal A due to the highly non-linear characteristics of the magnetic circuit as shown by curve S-P.

Figure 6:
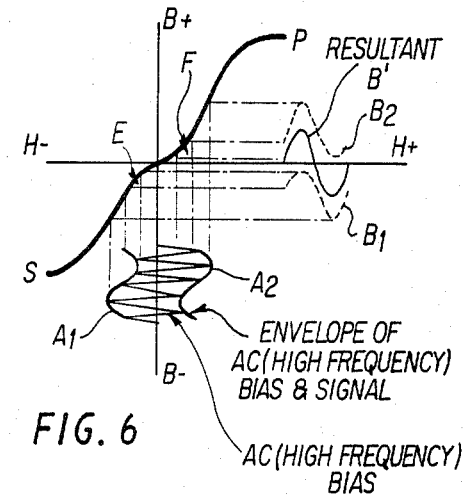
FIG. 6 is a graph of magnetic induction versus magnetic force for a Hall generator wherein a high frequency A.C. bias is applied.

It has been discovered that by adding a high frequency alternating current bias to a magnetic circuit that the magnetic flux developed in the circuit is more accurately representative of the input signal. As shown in FIG. 6, the application of a high frequency A.C. bias to the input signal A causes the input signal A to be modulated at the bias frequency. The envelope of the resultant signal $A_1$ and $A_2$ is thus shifted away from the highly non-linear portion E-F curve S-P to portions of curve S-P which are more nearly linear. The resultant changes in magnetic flux (curves $B_1$ and $B_2$ in FIG. 6) when added together (curve B') results in a composite magnetic flux which is an accurate representative of the signal being applied to the magnetic circuit.

Such a biasing phenomena has been well-known for use in the magnetic tape recorder art. See for example "Magnetic Recording", C. Lowman, McGraw-Hill, 1972, pages 69–74. Heretofore however, this phenomena has not been exploited in conjunction with Hall-effect generators used for measuring power in electrical distribution systems.

As shown in FIG. 4, a high frequency A.C. bias is applied by means of frequency generator 110 which is coupled via transformer windings 120 to magnetic circuit 12. Preferably, the frequency of the A.C. bias is at least two to three times that of the distribution system line frequency (typically 50 or 60 Hz).

Figure 7:
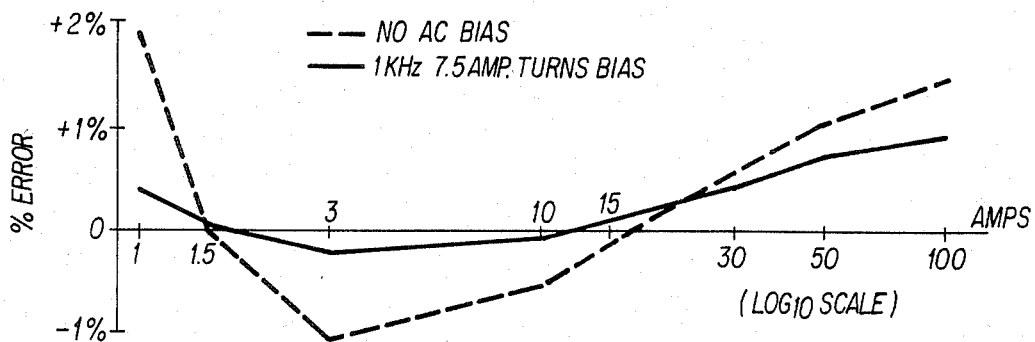
FIG. 7 is a graph of percent error versus current for two samples of the present invention: one using A.C. bias and the other not using A.C. bias.

FIG. 7 shows a graph of two samples of the present invention constructed according to FIG. 4 in which percent error of measured power is plotted as a function of current flowing through live wires L1 and L2. The dashed line indicates a test run when no A.C. bias was applied to magnetic circuit 12; the solid line indicates a test run with an A.C. bias of approximately 1 KHz with transformer coupling 120 being 7.5 ampere-turns. The output of Hall generator 10 was adjusted such that the percentage error at 1.5 and 15 amperes for the both the biased and unbiased tests were minimized. As is apparent from FIG. 7, when Hall generator 10 is unbiased the percent error can vary widely over the measurement range (typically 1 to 100 amperes). With A.C. biasing applied however, the percentage error is greatly minimized especially at low to medium (1 to 15 amperes) of current flow. This in turn translates into higher accuracy in the measurement of electrical power (or energy if power is accumulated over time) by the Hall-effect generator.

While the present invention has been described in considerable detail, it is understood that various improvements and modifications to the present invention would occur to one of ordinary skill in the art. Accordingly, the foregoing is not intended to be limitative but merely descriptive of the invention which is described in the appended claims.

What is claimed is:

1. A system for measuring alternating current transmitted over an electrical distribution circuit having at least three lines, one line being at ground potential and the other lines being at an elevated potential with respect thereto, the system comprising:
   galvanomagnetic transducer means, including a magnetic circuit magnetically coupled to one of the elevated lines;
   current transformer means magnetically coupled to each of the other elevated lines; and
   means for magnetically linking each of the current transformer means and the magnetic circuit of the transducer means, whereby a magnetic flux is induced in the transducer means which is proportional to the vector sum of the currents in each of the elevated lines.

2. The system of claim 1 wherein the means for magnetically linking each of the current transformer means and the magnetic circuit of the tranducer means comprises a first winding coupled to each of the current transformers and a second winding coupled to the magnetic circuit, the first and second windings being electrically connected together.

3. The system of claim 1 wherein the galvanomagnetic transducer means is a Hall-effect device disposed in the magnetic circuit, the Hall-effect device including a first pair of terminals and means for applying a current thereto, and a second pair of terminals and means for measuring a voltage induced in the Hall-effect device between the second pair of terminals.

4. The system of claim 3 further including means for deriving a current representative of the voltage potential between the elevated lines and for applying this voltage-representative current to the first pair of terminals of the transducer means, wherein the output voltage of the transducer means is representative of the product of the vector sum of the currents in the elevated lines and the voltage-representative current.

5. The system of claim 4 wherein the output voltage of the transducer means is indicative of the instantaneous electrical power being used by at least one load connected to the distribution lines and further includes means, responsive to the output voltage of the transducer means, to accumulate the power indicative output over time and to produce therefrom an output which is indicative of the electrical energy being used by the load.

6. A system for measuring electrical power being used by at least one load connected to a distribution circuit having at least three lines, one of the lines being at ground potential and the other lines being at an elevated potential with respect thereto, the system comprising:
a Hall-effect generator including: a magnetic core having a gap, a material exhibiting galvanomagnetic properties disposed in the gap, and first and second pairs of terminals attached to the galvanomagnetic material, the magnetic core being magnetically coupled to one of the elevated lines;
a current transformer magnetically coupled to each of the other of the elevated lines;
means for applying a signal derived from the potential between the elevated lines to the first pair of terminals attached to the galvanomagnetic material; and
means for magnetically linking each current transformer and the magnetic core of the Hall-effect generator, whereby a voltage is induced in the galvanomagnetic material between the second pair of terminals which is proportional to the product of the voltage-representative signal and the vector sum of the currents flowing in the elevated lines and is indicative of the instantaneous power used by the load.

7. The system of claim 6 further including means, responsive to the output of the Hall-effect generator, to accumulate the power indicative output over time and to produce therefrom an output which is indicative of the electrical energy being used by the load.

8. In an alternating current electrical transmission system having at least three lines, one line being at ground potential and the other lines being at an elevated potential with respect thereto, a method of measuring electrical currents flowing in the transmission system, comprising the steps of:
measuring current flowing in one of the elevated lines by means of a first magnetic circuit magnetically coupled to said line;
measuring current flowing in the other elevated lines by means of additional magnetic circuits magnetically coupled to each of the other lines; and
magnetically summing the currents measured by the additional magnetic circuits in the first magnetic circuit and generating in a galvanomagnetic material disposed in the first magnetic circuit an electrical output proportional to the vector sum of the currents measured by the first and additional magnetic circuits.

9. The method of claim 8 further including the steps of:
measuring the electrical potential between the elevated lines; and
applying the measured electrical potential to the galvanomagnetic material to generate an output indicative of the power being used by at least one load connected to the transmission system.

10. The method of claim 9 further including the step of accumulating, over time, the power indicative output and generating therefrom an output indicative of energy used by the load.

11. A system for measuring alternating current transmitted over an electrical distribution circuit having at least three lines, one line being at ground potential and the other lines being at an elevated potential with respect thereto, the system comprising:
galvanomagnetic transducer means, including a magnetic circuit coupled to one of the elevated lines;
current transformer means coupled to each of the other elevated lines;
means for magnetically linking each of the current transformer means and the magnetic circuit of the transducer means, whereby a magnetic flux is induced in the transducer means which is proportional to the vector sum of the currents in each of the elevated lines; and
means for applying an alternating current signal to the magnetic circuit of the transducer means, whereby to cause the output of the transducer means to be more nearly linear with changes in the flux induced in the magnetic circuit.

12. In an alternating current electrical transmission system having at least three lines, one line being at ground potential and the other lines being at an elevated potential with respect thereto, a method of measuring electrical currents flowing in the transmission system, comprising the steps of:
measuring current flowing in one of the elevated lines by means of a first magnetic circuit coupled to said line;
measuring current flowing in the other elevated lines by means of additional magnetic circuits coupled to each of the other lines;
magnetically summing the currents measured by the additional magnetic circuits in the first magnetic circuit and generating in a galvanomagnetic material disposed in the first magnetic circuit an electrical output proportional to the vector sum of the currents measured by the first and additional magnetic circuits; and
applying an alternating current signal to the first magnetic circuit to cause the output of the galvanomagnetic material to be more nearly linear with changes in flux in the first magnetic circuit.

* * * * *